United States Patent
Henn

(10) Patent No.: US 9,807,917 B2
(45) Date of Patent: Oct. 31, 2017

(54) ELECTRONIC COMPONENT AND METHOD FOR PRODUCING THE ELECTRONIC COMPONENT

(75) Inventor: Gudrun Henn, Ebenhausen (DE)

(73) Assignee: QUALCOMM Incorporated, San Diego, CA (US)

( * ) Notice: Subject to any disclaimer, the term of this patent is extended or adjusted under 35 U.S.C. 154(b) by 398 days.

(21) Appl. No.: 13/977,000

(22) PCT Filed: Dec. 5, 2011

(86) PCT No.: PCT/EP2011/071761
§ 371 (c)(1),
(2), (4) Date: Sep. 9, 2013

(87) PCT Pub. No.: WO2012/089443
PCT Pub. Date: Jul. 5, 2012

(65) Prior Publication Data
US 2013/0343028 A1    Dec. 26, 2013

(30) Foreign Application Priority Data
Dec. 30, 2010    (DE) .................. 10 2010 056 562

(51) Int. Cl.
*H05K 9/00* (2006.01)
*H03H 9/10* (2006.01)
(Continued)

(52) U.S. Cl.
CPC .......... *H05K 9/002* (2013.01); *B81B 7/0064* (2013.01); *B81B 7/0077* (2013.01); *H01L 23/29* (2013.01); *H01L 23/3135* (2013.01); *H03H 9/02* (2013.01); *H03H 9/105* (2013.01); *H03H 9/1092* (2013.01); *H05K 5/0091* (2013.01); *H01L 23/3121* (2013.01); *H01L 2924/0002* (2013.01); *Y10T 156/11* (2015.01)

(58) Field of Classification Search
CPC ........ H05K 9/00; H05K 5/0091; H03H 9/105; H01L 23/29
USPC .......... 361/814; 310/334, 364, 365; 156/701
See application file for complete search history.

(56) References Cited

U.S. PATENT DOCUMENTS

| 4,028,648 A | 6/1977 | Hartmann et al. |
| 6,295,205 B1 | 9/2001 | Lang et al. |
| (Continued) |

FOREIGN PATENT DOCUMENTS

| DE | 4328794 A1 | 3/1995 |
| DE | 19839422 A1 | 3/2000 |
| (Continued) |

OTHER PUBLICATIONS

English Translation of EP 1646145 Osaka.*
(Continued)

*Primary Examiner* — Dion R Ferguson
*Assistant Examiner* — Mandeep S Buttar
(74) *Attorney, Agent, or Firm* — Patterson & Sheridan, L.L.P

(57) ABSTRACT

The invention specifies an electronic component which has a first electrode (10), a second electrode (20), an active region (30), which is electrically coupled to the first electrode (10) and to the second electrode (20), and a housing (100), wherein the housing (100) contains carbon layers which are monoatomic at least in subregions.

17 Claims, 7 Drawing Sheets

(51) Int. Cl.
*B81B 7/00* (2006.01)
*H01L 23/29* (2006.01)
*H03H 9/02* (2006.01)
*H05K 5/00* (2006.01)
*H01L 23/31* (2006.01)

(56) References Cited

U.S. PATENT DOCUMENTS

| | | | |
|---|---|---|---|
| 6,818,464 B2* | 11/2004 | Heschel | G02B 6/4201 |
| | | | 257/E21.597 |
| 7,448,119 B2 | 11/2008 | Ozaki | |
| 2003/0198021 A1 | 10/2003 | Freedman | |
| 2003/0210111 A1 | 11/2003 | Shin | |
| 2004/0166603 A1* | 8/2004 | Carley | B81C 1/00333 |
| | | | 438/52 |
| 2005/0214974 A1* | 9/2005 | Field | H03H 3/0073 |
| | | | 438/106 |
| 2006/0210234 A1* | 9/2006 | Shiv | B81C 1/00301 |
| | | | 385/147 |
| 2007/0035364 A1 | 2/2007 | Sridhar et al. | |
| 2007/0056855 A1 | 3/2007 | Lo et al. | |
| 2007/0188268 A1 | 8/2007 | Naito et al. | |
| 2007/0278897 A1 | 12/2007 | Ozaki | |
| 2008/0202657 A1 | 8/2008 | Hammel | |
| 2009/0117386 A1* | 5/2009 | Vacanti | B32B 27/00 |
| | | | 428/408 |
| 2009/0201102 A1 | 8/2009 | Oda | |
| 2010/0084697 A1 | 4/2010 | Kopp et al. | |
| 2010/0089636 A1 | 4/2010 | Ramadas et al. | |
| 2010/0109486 A1 | 5/2010 | Polyakov et al. | |
| 2010/0143726 A1 | 6/2010 | Golzhauser et al. | |
| 2010/0171393 A1 | 7/2010 | Pei et al. | |
| 2010/0218801 A1* | 9/2010 | Sung | B82Y 30/00 |
| | | | 136/244 |
| 2010/0224980 A1* | 9/2010 | Chahal | B81B 7/007 |
| | | | 257/690 |
| 2011/0133607 A1 | 6/2011 | Lee et al. | |
| 2012/0228993 A1 | 9/2012 | Colli | |
| 2012/0234559 A1 | 9/2012 | Howlett et al. | |
| 2015/0225231 A1* | 8/2015 | Henn | H03H 9/02393 |
| | | | 310/312 |

FOREIGN PATENT DOCUMENTS

| | | |
|---|---|---|
| DE | 10328373 A1 | 2/2005 |
| DE | 102008001000 A1 | 10/2009 |
| EP | 1646145 A1 | 4/2006 |
| EP | 2436648 A1 | 4/2012 |
| JP | 2002094356 A | 3/2002 |
| JP | 2002290199 A | 10/2002 |
| JP | 2005057707 A | 3/2005 |
| JP | 2005137970 A * | 6/2005 |
| JP | 2005354651 A | 12/2005 |
| JP | 2006121259 A | 5/2006 |
| JP | 2007325013 A | 12/2007 |
| JP | 2008210895 A | 9/2008 |
| JP | 2010511267 A | 4/2010 |
| JP | 2010141939 A | 6/2010 |
| JP | 2010235401 A | 10/2010 |
| WO | 2004/114425 A1 | 12/2004 |
| WO | 2005/038907 A2 | 4/2005 |
| WO | 2005/099088 A1 | 10/2005 |
| WO | 2006/133466 A1 | 12/2006 |
| WO | WO-2008057045 A1 | 5/2008 |
| WO | WO-2009049375 A1 | 4/2009 |
| WO | 2009/121901 A1 | 10/2009 |
| WO | WO-2010137592 A1 | 12/2010 |

OTHER PUBLICATIONS

J.S. Bunch, et al., "Impermeable Atomic Membranes from Graphene Sheets," Nano Letters, Jan. 1, 2008, pp. 2458-2462, vol. 8, No. 8, American Chemical Society, US.
A.P. Graham, et al., "Towards the integration of carbon nanotubes in microelectronics," Diamond and Related Materials, Apr. 1, 2004, pp. 1296-1300, iss. No. 13, No. 4-8, Elsevier Science Publishers, Amsterdam, NL.
X. Ji, et al., "Micromechanics prediction of the effective elastic moduli of graphene sheet-reinforced polymer nanocomposites," Modeling and Simulation in Materials Science and Engineering, Jun. 1, 2010, pp. 1-16, vol. 18, No. 4, IOP Publishing Ltd., Bristol, GB.
M. Dragoman, et al., "High performance thin film bulk acoustic resonator covered with carbon nanotubes," Applied Physics Letters, Oct. 6, 2006, pp. 143122-1-143122-3, iss. No. 89, No. 14, American Institute of Physics, Melville, US.
"Graphene," <http://en.wikipedia.org/w/index.php?title=Graphene&oldid=556045238>, Wikipedia, modified May 21, 2013, 19 pgs.
"Carbon nanotube," <http://en.wikipedia.org/w/index.php?title=Carbon_nanotube&oldid=556050117>, Wikipedia, modified May 21, 2013, 22 pgs.
International Search Report and Written Opinion—PCT/EP2011/071761-ISA/EPO—Mar. 22, 2012.

* cited by examiner

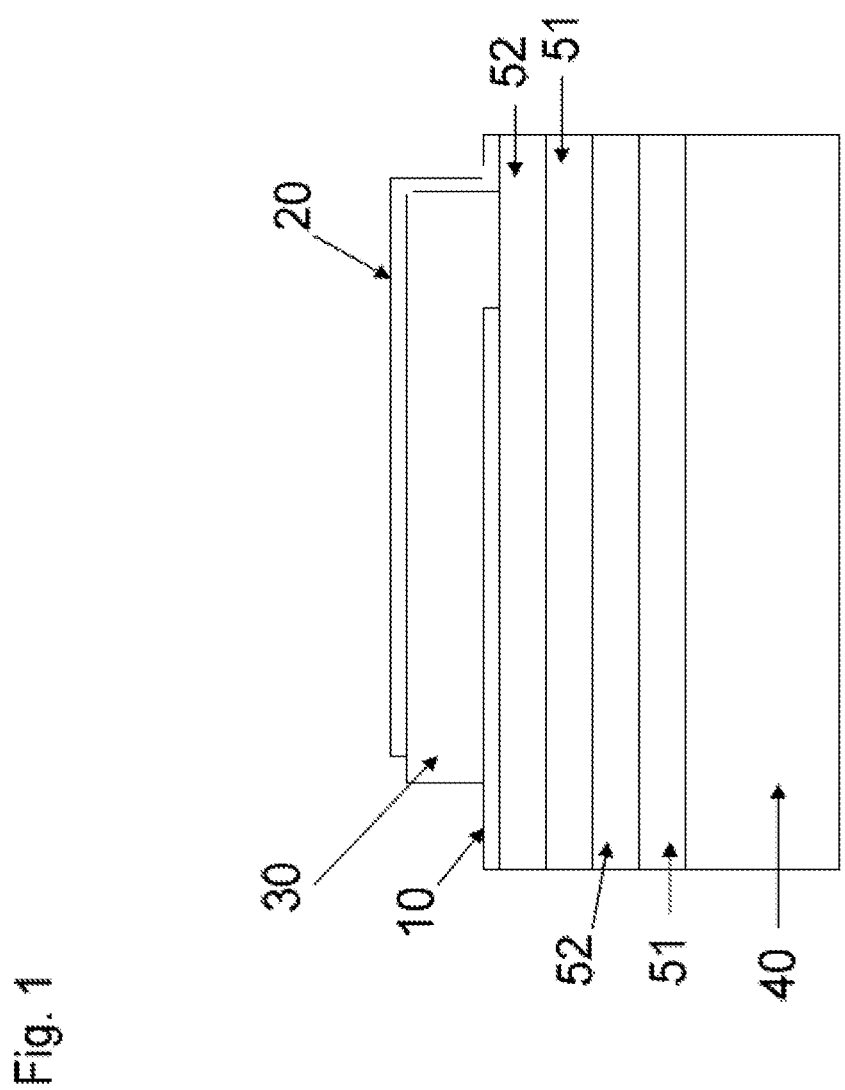

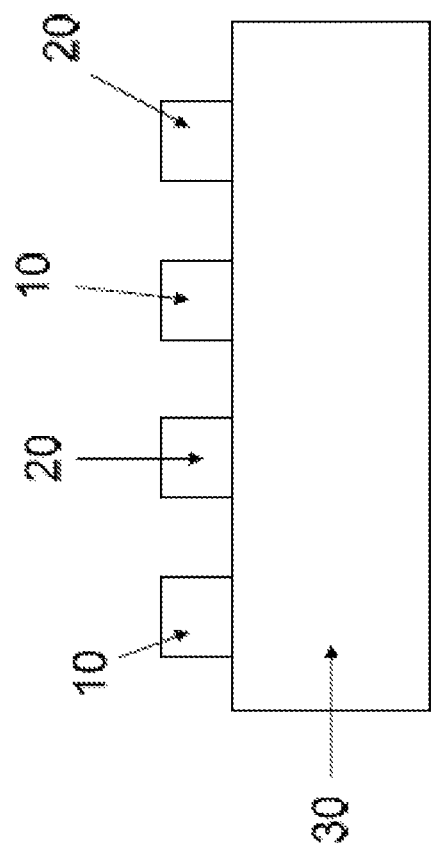

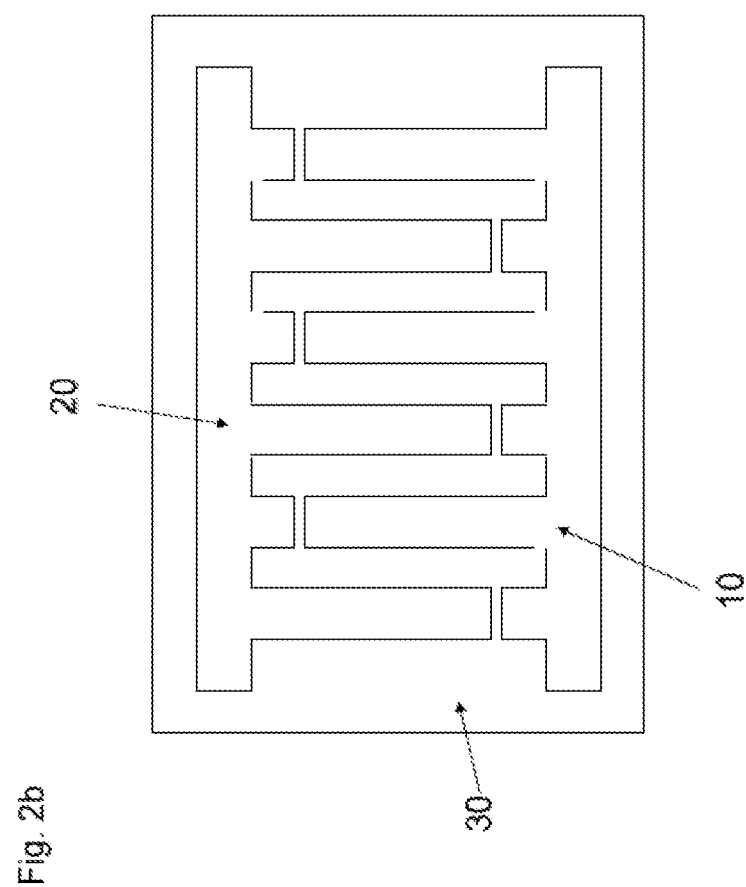

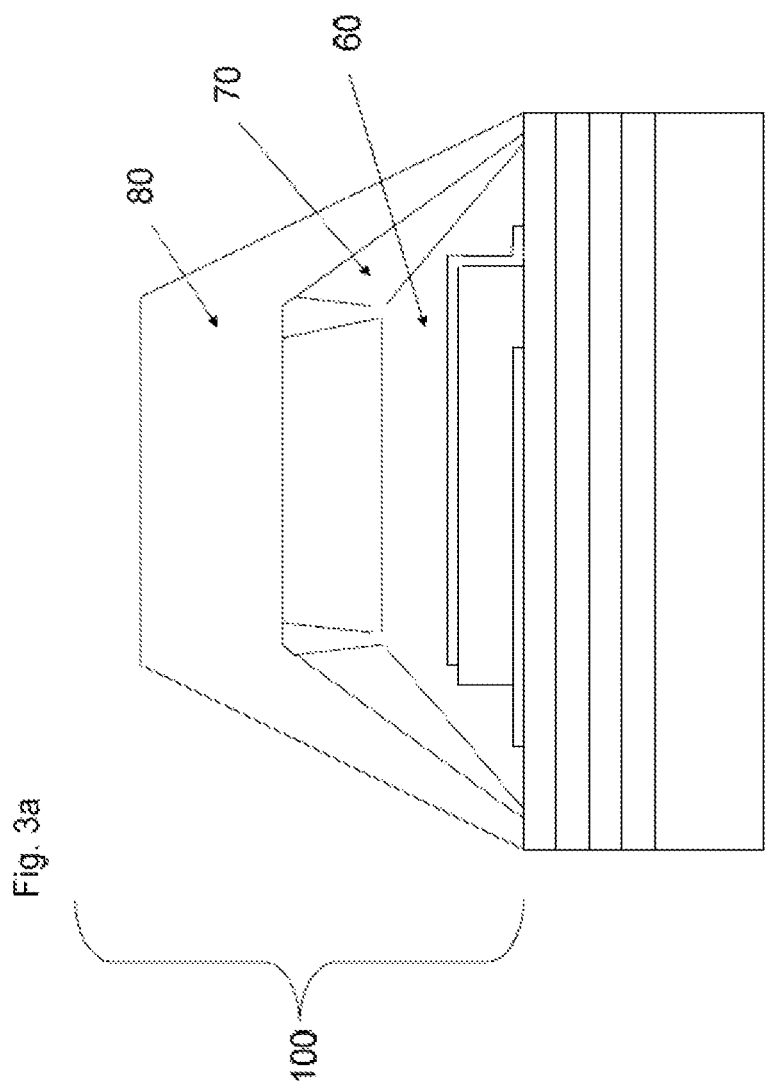

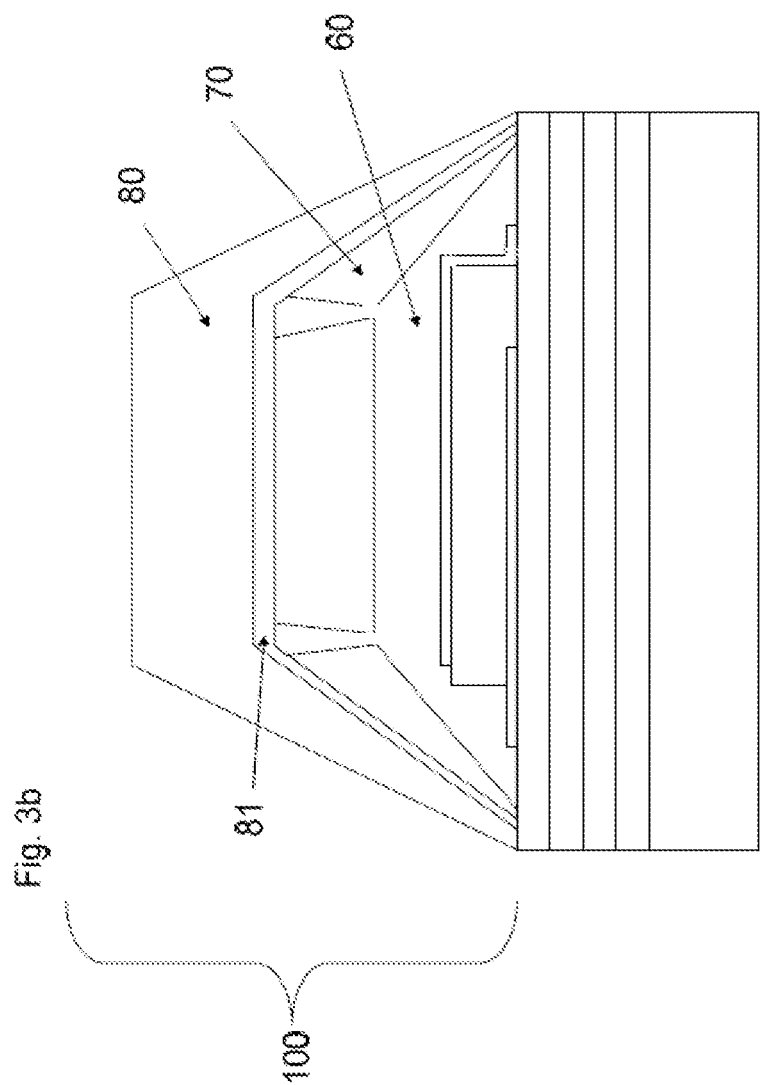

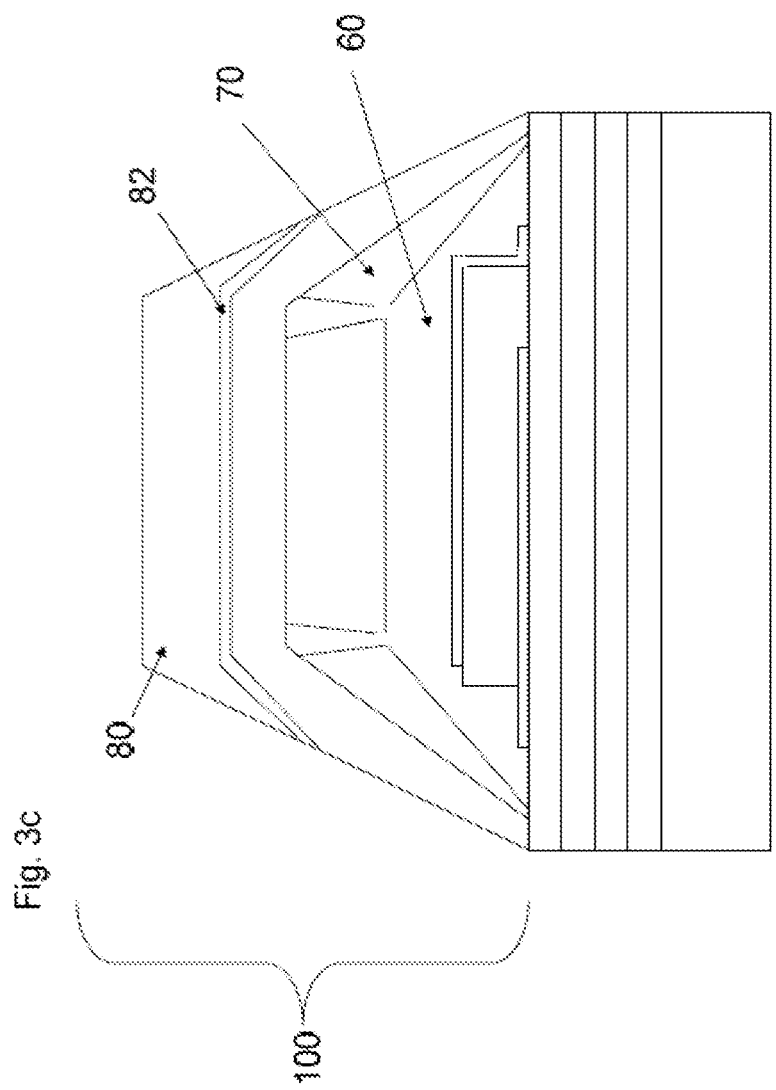

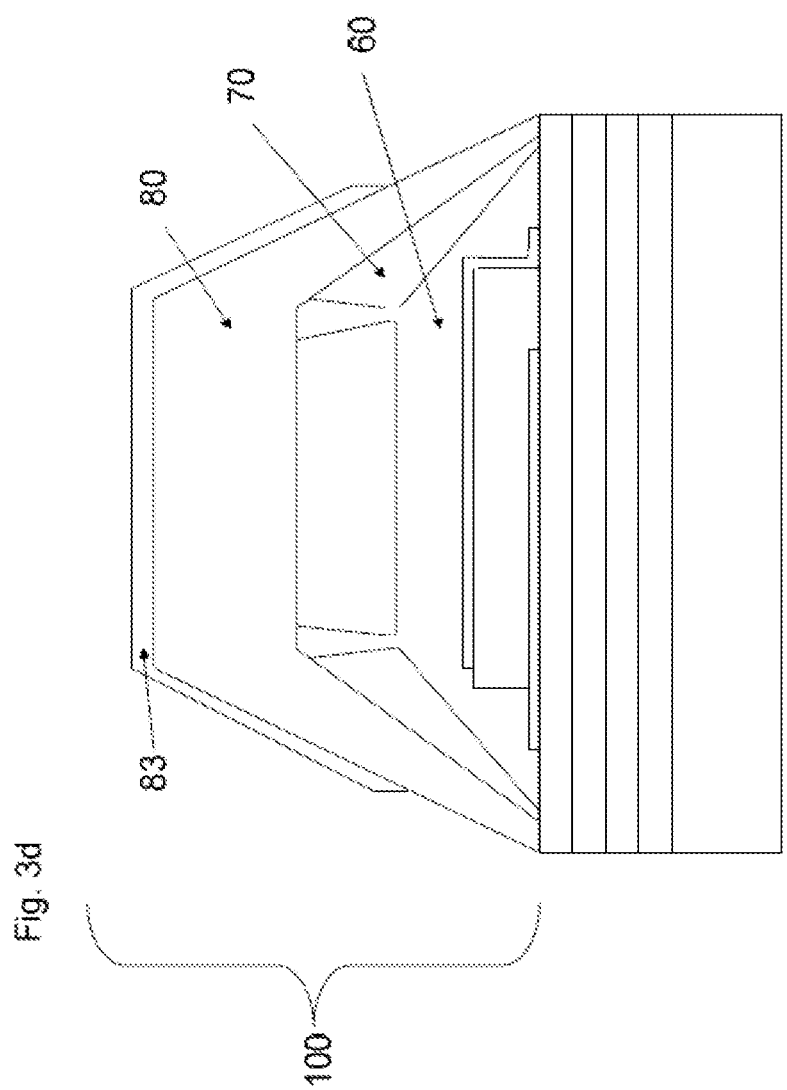

ELECTRONIC COMPONENT AND METHOD FOR PRODUCING THE ELECTRONIC COMPONENT

An electronic component is specified, as is a method for producing the electronic component.

Housings of electronic components, which are also understood to include micromechanical components, such as surface-acoustic-wave-based or bulk-acoustic-wave-based components, for example, generally require cavities. Housings having cavities have been produced by various methods heretofore; these include for example the construction of a frame structure for example on a ceramic as spacer and lateral boundary, flip-chip of the component and covering with a plastic, or the production of a depression in a wafer, construction of a frame structure for connection and as lateral boundary, flip-chip of the complete wafer and subsequent wafer bonding, that is to say consolidation of the connection. In this case, the wafer can consist of silicon or of niobates/tantalates, for example. The chips are then singulated.

It is an object of at least one embodiment of the invention to provide an electronic component comprising a housing which is reduced in terms of its size and has an improved stability relative to conventional housings. It is an object of a further embodiment to provide a method for producing such an electronic component. These objects are achieved by means of an electronic component according to claim 1 and by means of a method according to claim 14.

An electronic component is specified which comprises a first electrode, a second electrode, an active region, which is electrically coupled to the first electrode and the second electrode, and a housing, wherein the housing contains monoatomic carbon layers at least in partial regions.

In this context, "electrically coupled" is understood to mean an ohmic or an electromagnetic contact.

An electronic component is thus provided which contains a synthetic material in the form of monoatomic carbon layers at least in partial regions on its housing. On account of the monoatomic carbon layers, the housing has an increased mechanical and static stability. The monoatomic carbon layers can additionally be conductive, such that, as a result of the use thereof, the housing has a radiofrequency (RF)-shielding function. Alternatively, the monoatomic carbon layers can also be modified with fluorine, for example, such that they are insulating.

The monoatomic carbon layers can be planar, shaped to form tubes, or partly planar and partly shaped to form tubes. Planar monoatomic carbon layers can be designated as graphene, and monoatomic carbon layers shaped to form tubes can be designated as nanotubes.

Therefore, graphene, nanotubes or mixtures of graphene and nanotubes can be present in partial regions of the housing. Both types of monoatomic carbon layers have a high mechanical and static stability and can be embodied in conductive fashion. On account of these properties, they can be used in a housing for electronic components.

Graphene is a defined polycyclic aromatic hydrocarbon which can also be functionalized. This can be a yellow or orange-colored solid. Its basic structure is based on hexa-peri-hexabenzocoronene (HBC), which is insoluble in most solvents. This basic structure can be substituted by alkyl chains, for example, as a result of which the substituted graphene becomes soluble in solvents.

Both in crystalline form and in solution, graphene can be arranged in columnar fashion. In this case, aromatic cores can be arranged one directly above another. The columnar arrangement is referred to as self-assembly and forms depending on the substituents on the graphene, the temperature and the concentration, if the arrangement takes place in solution. As a result of the columnar arrangement in solution, it is possible to produce, for example, thin surface films having well-ordered layers—in the ideal case without defects—and a high charge carrier mobility.

The graphenes arranged in columnar fashion can be applied on a substrate, for example, in the so-called edge-on arrangement. In this case, the individual columns are arranged parallel to the substrate. Alternatively, the graphene can be arranged in its columnar arrangement in the so-called face-on orientation on a substrate. In this case the individual columns are arranged perpendicularly to the substrate. Both arrangements are distinguished by high order within the graphene layer.

The graphene as well as the nanotubes, that is to say the monoatomic carbon layers, can be arranged as monolayers or as multilayers in the electronic component. Consequently, the carbon layers can be present as isolated layers or as layers arranged one above another, which can have high order in the housing of the electronic component.

The arrangement as a multilayer, in particular, brings about a particularly high mechanical and static stability in a housing. The housing can be a so-called thin film package that is scratch-resistant and protects the active region of the electronic component against environmental influences. Thin film package is understood to mean a layer sequence having a plurality of layers arranged one above another. In order to achieve sufficient stability, hitherto thick nitride, oxide or epoxide layers have been used for this purpose. As a result of the use of monolayers or multilayers of monoatomic carbon layers at least in partial regions of the housing, the housing thickness can be reduced since the monoatomic carbon layers of thinner embodiment have an increased stability in comparison with previous materials. A housing embodied as a thin film package can already be applied to the active region during the production of the electronic component, before the components are singulated.

The designation "on" here and hereinafter is understood to mean an order encompassing both direct succession and the relative arrangement with respect to one another, wherein further elements can be arranged between the successive elements.

The electronic component can be an electroacoustic component, wherein the active region comprises a piezoelectric layer. The piezoelectric layer can contain AlN, for example.

In the electrical component, the first and second electrodes can be arranged on one side of the piezoelectric layer or on mutually opposite sides of the piezoelectric layer. The first variant is a surface-acoustic-wave-based component, and the second variant is a bulk-acoustic-wave-based component.

In the electronic component, the first and/or the second electrode can comprise a plurality of layers arranged one above another, thus resulting in a sandwich structure. Exemplary materials are selected is from a group comprising Ti, Mo, mixtures of Ti and Mo, Pt, Ru, W, Al, Cu and mixtures of Al and Cu.

By way of example, a sandwich structure having the following construction can be formed: Ti, Al/Cu, W. A further possible sandwich structure has the following construction: Mo, Ti/Mo, Ru. Such a sandwich structure can constitute for example the electrode of a bulk-acoustic-wave-based component in which the piezoelectric layer is arranged on a substrate, the first electrode is arranged between the substrate and the piezoelectric layer and the second electrode is arranged on the piezoelectric layer on the side facing away from the substrate. In this case, the sandwich structure can form for example the first electrode of the component.

A further example of a sandwich structure is an Al layer or an Al/Cu layer. Such an electrode can constitute, for example, the first and/or second electrode of a surface-acoustic-wave-based component in which both electrodes are arranged on one side of the piezoelectric layer.

The two electrodes of a surface-acoustic-wave-based component can have a so-called comb structure in which fingers of the comb of the first and second electrodes are arranged alternately successively on the piezo-electric substrate. In this case, electromagnetic waves can form between the respective first and second electrodes.

Furthermore, in accordance with a further embodiment, the electronic component can have a housing having a cavity arranged on the active region. Furthermore, a layer sequence spanning the cavity can be arranged on the cavity.

Thus, by way of example, the arrangement can be as follows: first electrode, active region on the first electrode, second electrode on the active region, cavity on the second electrode and the active region, layer sequence of the housing on the cavity. Alternatively, the construction could also appear as follows: active region, first and second electrodes on the active region, cavity on the first and second electrodes and the active region, layer sequence of the housing on the cavity.

The layer sequence can have at least one stabilizing layer comprising monatomic carbon layers. In this case, the stabilizing layer can be arranged within the layer sequence, as a layer completely enclosing the cavity, or as a layer terminating the layer sequence toward the outside. That means that the stabilizing layer can be arranged, in principle, at any desired location of the housing. It can be arranged such that it completely encloses the cavity. It can be arranged for example centrally within the layer sequence or as the last layer of the layer sequence, which encloses the entire layer sequence, that is to say from above and laterally. In each of these positions, the monatomic carbon layers bring about an increased stability of the housing.

Furthermore, a first stabilizing layer can be arranged between the cavity and the layer sequence. Said first stabilizing layer can have monatomic carbon layers in addition or as an alternative to the at least one stabilizing layer of the layer sequence. The first stabilizing layer can be arranged as the layer directly spanning the cavity and can optionally also have structuring.

The at least one stabilizing layer of the layer sequence can additionally be embodied as radiofrequency (RF)-shielding and/or heat-dissipating. The RF shielding can be brought about by the conductivity of the monatomic carbon layer. Monatomic carbon layers have an electrical conductivity that is higher than, for example, that of copper. Thus, graphene can have a conductivity of 108 S/m, for example. By means of additives, for example metals, the conductivity of graphene and also of nanotubes can be increased even further, such that the radiofrequency shielding is embodied particularly reliably.

The thermal conductivity can also be controlled by additives in the stabilizing layer containing graphene and/or nanotubes. Thus, by way of example, monatomic carbon layers can be combined with inorganic materials. By way of example, the monatomic carbon layers can be modified with fluorine, thus resulting in fluorographenes, for example.

If no electrical conductivity is intended to be present in the stabilizing layer, the latter can be modified by addition of oxygen or fluorine, for example, such that it is embodied in an electrically insulating fashion.

The remaining layers of the layer sequence of the housing can contain conventional materials, which can be embodied with thinner layer thicknesses than is conventionally the case, however, since the required stability of the housing can be achieved by means of the monoatomic carbon layers.

The electronic component can be embodied as a surface-acoustic-wave-based component, as a bulk-acoustic-wave based component or as a microelectromechanical component. A surface-acoustic-wave-based component can also be designated as SAW component (SAW: surface acoustic wave). A bulk-acoustic-wave-based component can also be designated as BAW component (BAW: bulk acoustic wave).

It is therefore possible to provide for example SAW or BAW filters, resonators or sensors and also waveguides or delay lines with the electronic component. Furthermore, the electronic component can constitute a so-called guide bulk-acoustic-wave-based component. Furthermore, filters can be used to construct duplexers and to produce further complex modules. Such electroacoustic components can be used in mobile radio, for example.

A housing which is embodied in accordance with the above explanations, that is to say comprises graphene and/or nanotubes at least in partial regions, has a high durability with respect to tension and pressure, since graphene is 200 times stabler than steel, for example. Furthermore, graphene and/or nanotubes can be made conductive by addition of other materials such that a layer in the housing which comprises such material has a better conductivity than pure silver at room temperature. Since graphene has a thermal conductivity of 100 W/(mK), the heat dissipation within a housing is likewise ensured.

Graphene and/or nanotubes retain these advantageous properties even if they are applied one above another as multilayers. Furthermore, such layers can be patterned by means of conventional semiconductor processes. Consequently, a stabilizing layer containing graphene and/or nanotubes can reduce the thickness of the layer sequence of the housing and simultaneously increase the stability and heat conduction. As a result of the conductivity, graphene and/or nanotubes can additionally improve the radiofrequency shielding of the electronic component. A smaller, stabler and more reliable electronic component is thus provided.

In accordance with a further embodiment, a method for producing an electronic component is specified, which method comprises the method steps of A) applying a temporary layer on an arrangement comprising the first electrode, the second electrode and the active region, B) arranging a first stabilizing layer, which has openings, on the temporary layer, C) removing the temporary layer through the openings, and D) applying a layer sequence on the first stabilizing layer.

As a result of the temporary layer being applied, therefore, a cavity can be produced on the active region, and a stable layer sequence spanning the cavity can be arranged on the cavity.

In method steps B) and/or D), the first stabilizing layer and/or the layer sequence can furthermore be applied by means of a method selected from a group comprising chemical vapor deposition, physical vapor deposition, application of a solution and chemical surface reactions. Consequently, the housing can be produced and arranged on the active layer by means of diverse method techniques. The layer containing monoatomic carbon layers, which is applied directly on the cavity, in the layer sequence or as a layer terminating the layer sequence, can also be applied by means of one of these methods.

The invention will be explained in greater detail with reference to the figures and exemplary embodiments.

FIG. 1 shows the schematic side view of one embodiment of the electronic component.

FIG. 2a shows the schematic side view of a further embodiment of the electronic component.

FIG. 2b shows a schematic plan view of the electronic component in accordance with FIG. 2A, FIGS. 3 a) to d) show schematic side views of different embodiments of a housing on an electronic component in accordance with FIG. 1.

FIG. 1 shows the schematic side view of a bulk-acoustic-wave-based electroacoustic component. The latter comprises a substrate 40, in each case two first reflective layers 51 and second reflective layers 52, a first electrode 10, a second electrode 20 and a piezoelectric layer 30. The reflective layers constitute Bragg mirrors, wherein the first reflective layer 51 has a high acoustic impedance and the second reflective layer has a low acoustic impedance.

The first reflective layer 51 can contain tungsten, for example, and the second reflective layer 52 can contain $SiO_2$, for example. Reflective layers arranged in this way have a high reflectivity both for longitudinal waves and for shear waves. Therefore, these waves can be reflected so as to be guided back into the piezoelectric layer.

The substrate 40 can comprise Si or $SiO_2$, for example. The actual resonator is situated on the reflective layers and comprises the first electrode 10, the second electrode 20 and the piezoelectric layer 30. The piezo-electric layer can contain AlN, for example, and the two electrodes can comprise metals such as Ti, Mo, mixtures of Ti and Mo, Ru, Pt, W, Al, Cu and mixtures of Al and Cu. The electrodes can also contain a plurality of partial layers stacked one above another, wherein each partial layer contains a different material that can be selected from those enumerated above. By way of example, an electrode can have the sandwich structure Ti, Al/Cu, W. A further possible sandwich structure has the construction Mo, Ti/Mo, Ru.

On the arrangement such as is shown in FIG. 1, furthermore, a terminating oxide layer can be applied as passivation (not shown here).

FIG. 2a shows the schematic side view of a surface-acoustic-wave-based component. The latter comprises the piezoelectric layer 30, a first electrode 10 and a second electrode 20. FIG. 2b shows such a component in a schematic plan view. With the aid of this figure it is evident that the first electrode 10, and the second electrode 20 each have a comb-like structure, wherein each comb alternately has a short and a long finger. The fingers of the different combs are arranged alternately successively on the piezoelectric layer along the longitudinal axis of the piezoelectric layer 30. This is also evident in the schematic side view in FIG. 2a. Consequently, electromagnetic waves form between the individual fingers of the electrodes 10, 20, which waves can be converted into mechanical waves by the piezoelectric layer, and vice versa.

Above the components such as are illustrated schematically in FIGS. 1 and 2, in each case a housing 100 having a cavity can furthermore be applied, as shown in FIGS. 3a to d.

FIGS. 3a to d show by way of example the schematic side view of a housing 100 on the arrangement in accordance with FIG. 1. However, the housing 100 can equally be applied on the arrangement in accordance with FIG. 2 and other arrangements of electronic components.

For the sake of clarity, the reference signs for the arrangement of active layer, reflective layers, electrodes and active region are no longer shown in FIGS. 3a to d. FIG. 3 shows a cavity 60 above the active region, a patterned first stabilizing layer 70 above the cavity and a layer sequence 80. In this embodiment, the first stabilizing layer 70 is formed from a monoatomic carbon layer, graphene and/or nanotubes. On account of its high mechanical stability, it can stably span the cavity 60 and simultaneously bear the layer sequence 80.

The patterning of the first stabilizing layer 70 makes it possible to produce the cavity 60 in the housing 100. In order to produce the cavity 60, by way of example a temporary layer (not shown here) can be deposited onto the active layer 30 and/or the second electrode 20 and be patterned. Said temporary layer can consist of a photoresist, for example. The first stabilizing layer 70 is applied to the temporary layer and patterned, thus giving rise to openings in the first stabilizing layer 70. The temporary layer can be removed selectively through the openings in the first stabilizing layer 70. The cavity is formed as a result. By way of example, oxides or nitrides can be used as the temporary layer. In order to close the cavity, further stabilizing layers are applied on the first stabilizing layer 70, which form the layer sequence 80.

The layer sequence 80 brings about a further stabilization and seals the active region 30 against moisture. In this case, at least some of the layers of the layer sequence 80 can also be embodied as conductive and thus radiofrequency-shielding. Layers of the layer sequence 80 can comprise an epoxy material, which is applied by means of a printing method, or, if they are intended to be conductive, can consist of metals.

The housing 100 in accordance with FIG. 3b can be produced analogously. A stabilizing layer 81 in the layer sequence 80, which is applied on the first stabilizing layer 70, is shown here by way of example. The layer 81 contains graphene and/or nanotubes, stabilizes the first stabilizing layer 70 and simultaneously bears the layer sequence 80. A further function of the layer 81 is that of sealing the cavity in relation to the layer sequence 80.

The housing 100 in accordance with FIG. 3c can also be produced analogously to the method mentioned above. A layer 82 within the layer sequence 80, which contains graphene and/or nanotubes, is shown here by way of example. Such a layer increases the stability within the layer sequence 80.

The housing 100 in accordance with FIG. 3d can likewise be produced by means of a method as explained above. The stabilizing layer 83 is shown here by way of example, which layer seals the layer sequence 80 in relation to the atmosphere from above and from the side edges. In this embodiment, it contains contained graphene and/or nanotubes.

A housing 100 is also conceivable which has in combination a plurality of graphene- and/or nanotube-containing stabilizing layers 70, 81, 82 and 83 (not shown in the figures).

In addition to stabilizing functions, the stabilizing layers 81 and 83 can also have a radiofrequency-shielding function and a heat-conducting function. A housing is thus provided that has an increased reliability and is stable in relation to high pressure, high moisture and high temperatures. High temperatures and process pressures have to be kept away from the active region during the further processing of an electronic component, for example if 10 bar or more arise during the flip-chip of a module. This can likewise take place by means of the stable housing 100 in accordance with the explanations above.

The invention is not restricted by the description on the basis of the exemplary embodiments. Rather, the invention encompasses any novel feature and also any combination of features, which in particular includes any combination of features in the patent claims, even if this feature or this combination itself is not explicitly specified in the patent claims or exemplary embodiments.

LIST OF REFERENCE SIGNS

10 First electrode
20 Second electrode
30 Piezoelectric layer
40 Substrate
51 First reflective layer
52 Second reflective layer
60 Cavity
70 First stabilizing layer
80 Layer sequence
81 Stabilizing layer
82 Stabilizing layer
83 Stabilizing layer
100 Housing

The invention claimed is:

1. An electroacoustic component comprising:
 a first electrode;
 a second electrode;
 an active region comprising a piezoelectric layer, which is electrically coupled to the first electrode and the second electrode; and
 a housing disposed above the active region, wherein the housing is a thin film package comprising a stabilizing layer with a plurality of openings therein and a layer sequence which comprises a plurality of layers arranged one above another and which comprises graphene at least in partial regions, the layer sequence being disposed above the stabilizing layer.

2. The electroacoustic component according to claim 1, wherein the first and second electrodes are arranged on one side of the piezoelectric layer.

3. The electroacoustic component according to claim 1, further comprising a cavity arranged between the housing and the active region.

4. The electroacoustic component according to claim 3, wherein the layer sequence spans the cavity above the active region.

5. The electroacoustic component according to claim 4, wherein the layer sequence has at least one additional stabilizing layer comprising graphene layers.

6. The electroacoustic component according to claim 1, wherein the stabilizing layer comprises graphene layers.

7. The electroacoustic component according to claim 5, wherein the at least one additional stabilizing layer is arranged within the layer sequence as a layer completely enclosing the cavity, or as a layer terminating the layer sequence toward the outside.

8. The electroacoustic component according to claim 5, wherein the at least one additional stabilizing layer is additionally RF-shielding or heat-dissipating.

9. The electroacoustic component according to claim 1, which is embodied as a surface-acoustic-wave-based component, as a bulk-acoustic-wave-based component or as a microelectromechanical component.

10. A method for producing an electroacoustic component according to claim 1, comprising:
 A) applying a temporary layer on an arrangement comprising the first electrode, the second electrode, and the active region;
 B) arranging the stabilizing layer, which has the plurality of openings, on the temporary layer;
 C) removing the temporary layer through the openings; and
 D) applying the layer sequence on the stabilizing layer, wherein a graphene-containing layer is applied directly on a cavity of the housing, in the layer sequence, or as a layer terminating the layer sequence.

11. The method according to claim 10, wherein at least one of the arranging or the applying the layer sequence is carried out by a method selected from the group consisting of chemical vapor deposition, physical vapor deposition, application in solution, and chemical surface reactions.

12. The electroacoustic component according to claim 1, wherein the first and second electrodes are arranged on mutually opposite sides of the piezoelectric layer.

13. The electroacoustic component according to claim 1, wherein the openings in the stabilizing layer are arranged in a pattern.

14. The electroacoustic component according to claim 1, wherein at least one of the stabilizing layer or a layer in the layer sequence is electrically and thermally conductive.

15. The electroacoustic component according to claim 1, wherein at least one of the plurality of layers comprises epoxy.

16. The electroacoustic component according to claim 1, wherein the layer sequence is disposed directly above the stabilizing layer such that a bottommost layer of the layer sequence closes the openings in the stabilizing layer.

17. The electroacoustic component according to claim 1, wherein the graphene in the layer sequence is arranged as monolayers.

* * * * *